United States Patent [19]

Brasen et al.

[11] Patent Number: 5,308,798
[45] Date of Patent: May 3, 1994

[54] PREPLACEMENT METHOD FOR WEIGHTED NET PLACEMENT INTEGRATED CIRCUIT DESIGN LAYOUT TOOLS

[75] Inventors: Daniel R. Brasen, Grenoble, France; Siu-Tong Hui, San Jose, Calif.

[73] Assignee: VLSI Technology, Inc., San Jose, Calif.

[21] Appl. No.: 975,301

[22] Filed: Nov. 12, 1992

[51] Int. Cl.$^5$ ............................................. H01L 21/00
[52] U.S. Cl. ..................................... 437/250; 364/491; 364/490
[58] Field of Search ............................ 364/488–491; 437/250

[56] References Cited

U.S. PATENT DOCUMENTS

| | | |
|---|---|---|
| 4,562,453 | 12/1985 | Noguchi . |
| 4,611,236 | 9/1986 | Sato . |
| 4,661,815 | 4/1987 | Takayama et al. . |
| 4,791,474 | 12/1988 | Sugiura et al. . |
| 4,999,698 | 3/1991 | Okuno et al. . |
| 5,140,402 | 8/1992 | Murakata ............................ 364/491 |
| 5,231,590 | 7/1993 | Kumar et al. ....................... 364/491 |

FOREIGN PATENT DOCUMENTS

| | | |
|---|---|---|
| 57-121003 | 1/1984 | Japan . |
| 57-174302 | 4/1984 | Japan . |
| 62-219450 | 10/1987 | Japan . |
| 62-284031 | 5/1989 | Japan . |
| 64-247160 | 5/1991 | Japan . |

OTHER PUBLICATIONS

Wong and Liu, "A New Algorithm for Floorplan Design" *Dept. of Computer Science, Univ. of Illinois* (1986) Paper 7.1 pp. 101–107.

Hartoog, "Analysis of Placement of Procedures for FLSI Standard Cell Layout" *23rd Design Automation Conference* (1986) Paper 16.4 pp. 314–319.

LaPotin and Director, "Mason: A Global Floor-Planning Tool" *IEEE (1985) pp. 143–145*.

Sechen, "Chip-Planning, Placement, and Global Routing of Macro/Custom Cell Integrated Circuits Using Simulated Annealing" *IEEE Design Automation Conference* Paper 5.4 pp. 73–80; (1988).

Jackson and Kuh, "Performance-Driven Placement of Cell Based IC's" *IEEE Design Automation Conference* Paper 24.2 pp. 370–375 (1989).

*Primary Examiner*—Olik Chaudhuri
*Assistant Examiner*—H. Jey Tsai
*Attorney, Agent, or Firm*—Burns, Doane, Swecker & Mathis

[57] ABSTRACT

In a preplacement method for use in a computer-assisted integrated design layout process, circuit entities are placed by a computer program on a layout of an integrated circuit stored in computer memory. The circuit to be laid out is represented in computer memory as circuit entities interconnected between pins on the circuit entities. A set of pins to be interconnected forms a net and is assigned a weight. The method allows a user to cause the computer program to place a circuit entity at a different location on the integrated circuit layout than it would otherwise. A faked two pin net is defined, one pin being located on the circuit entity and another pin being located in a region of the integrated circuit in which the user desires the circuit entity to be placed. A high weight is then assigned to the faked two pin net that is much greater than weights assigned to other nets in the integrated circuit layout. The computer program then places the circuit entity in the region of the other pin in accordance with the high weight assigned to the faked net.

1 Claim, 5 Drawing Sheets

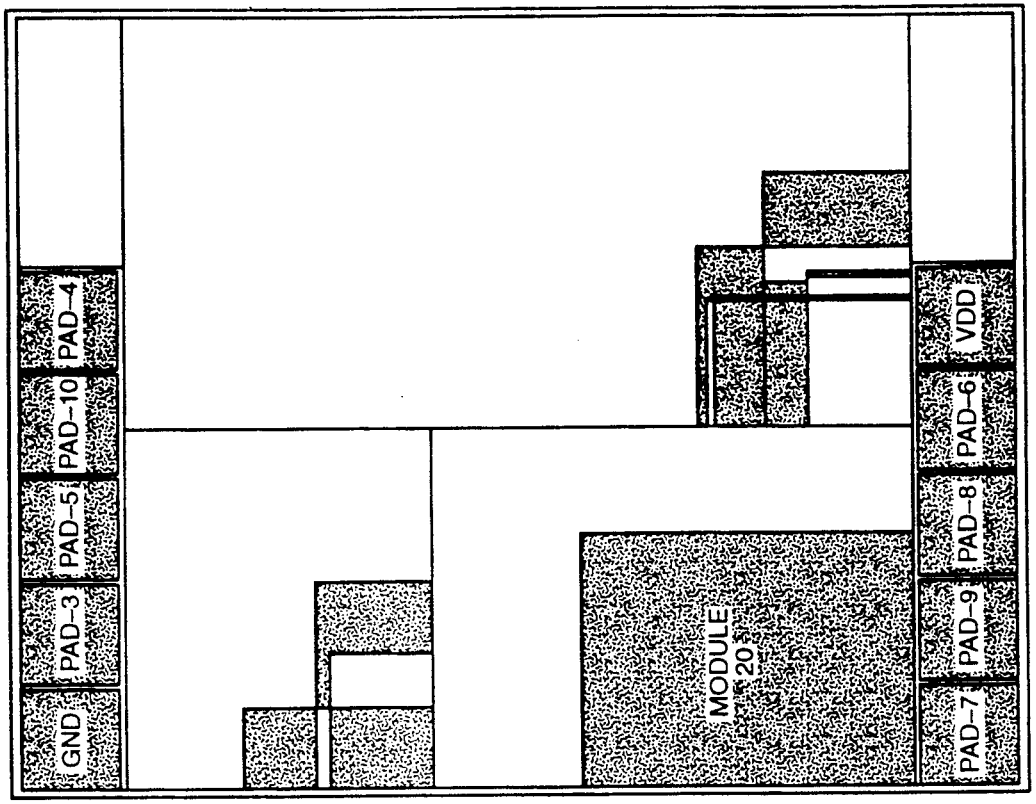
FIG._1B (PRIOR ART)
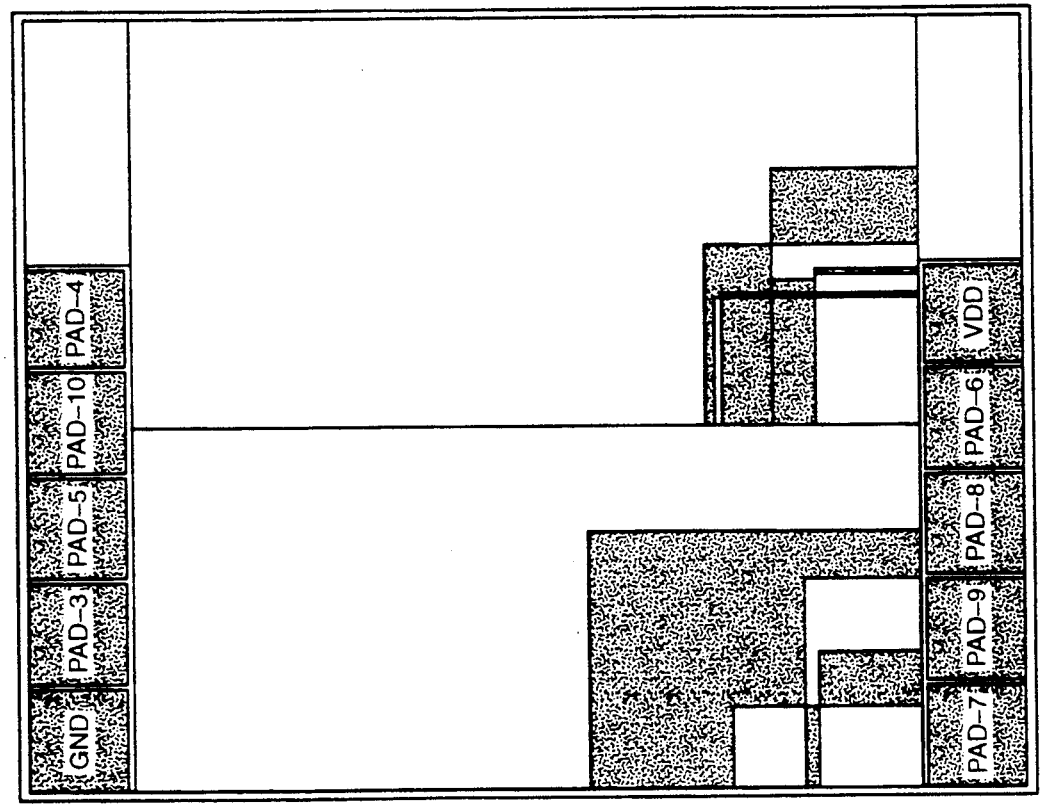
FIG._1A (PRIOR ART)

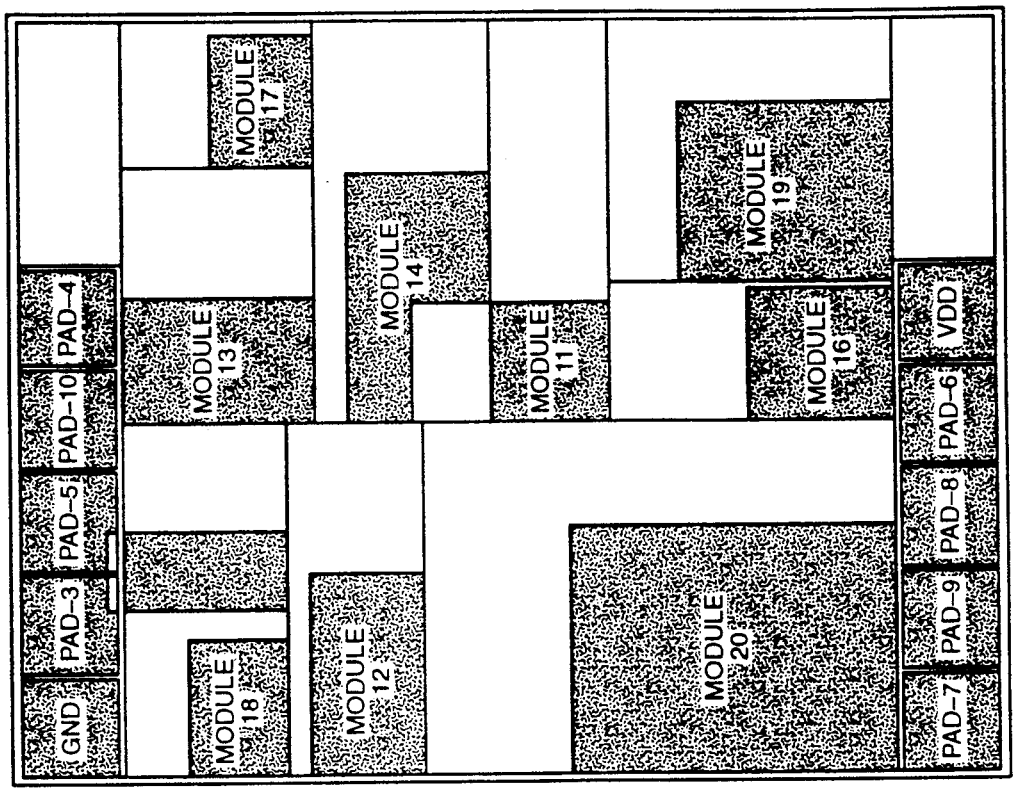
FIG._1D (PRIOR ART)
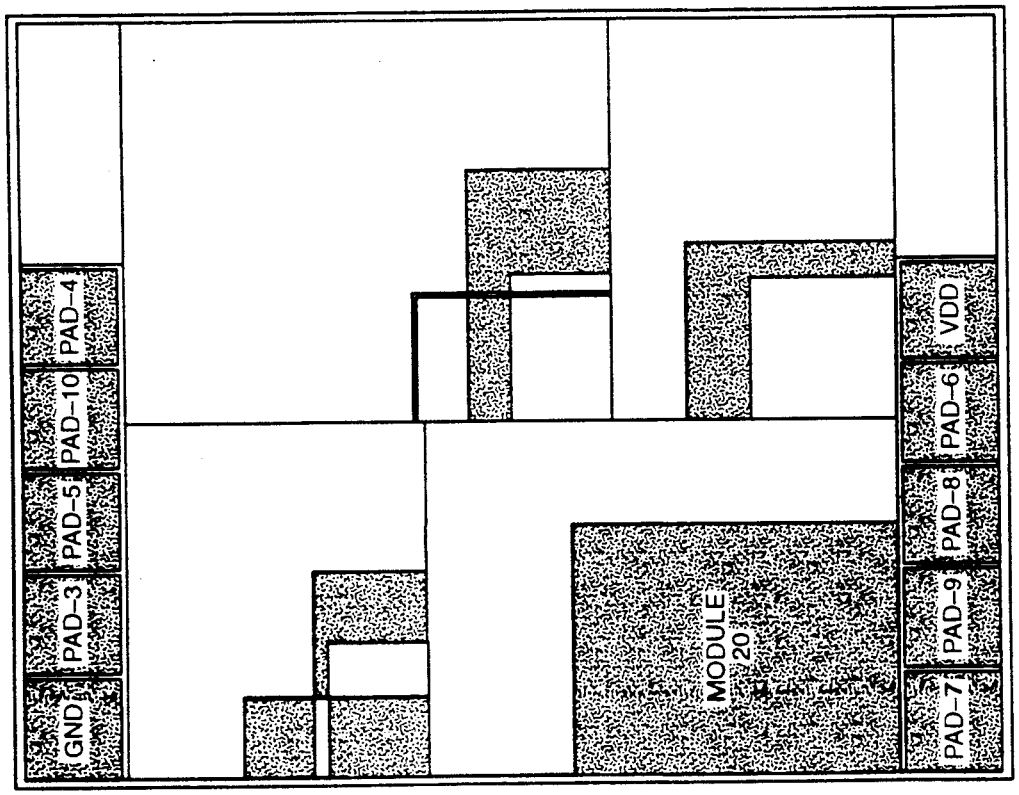
FIG._1C (PRIOR ART)

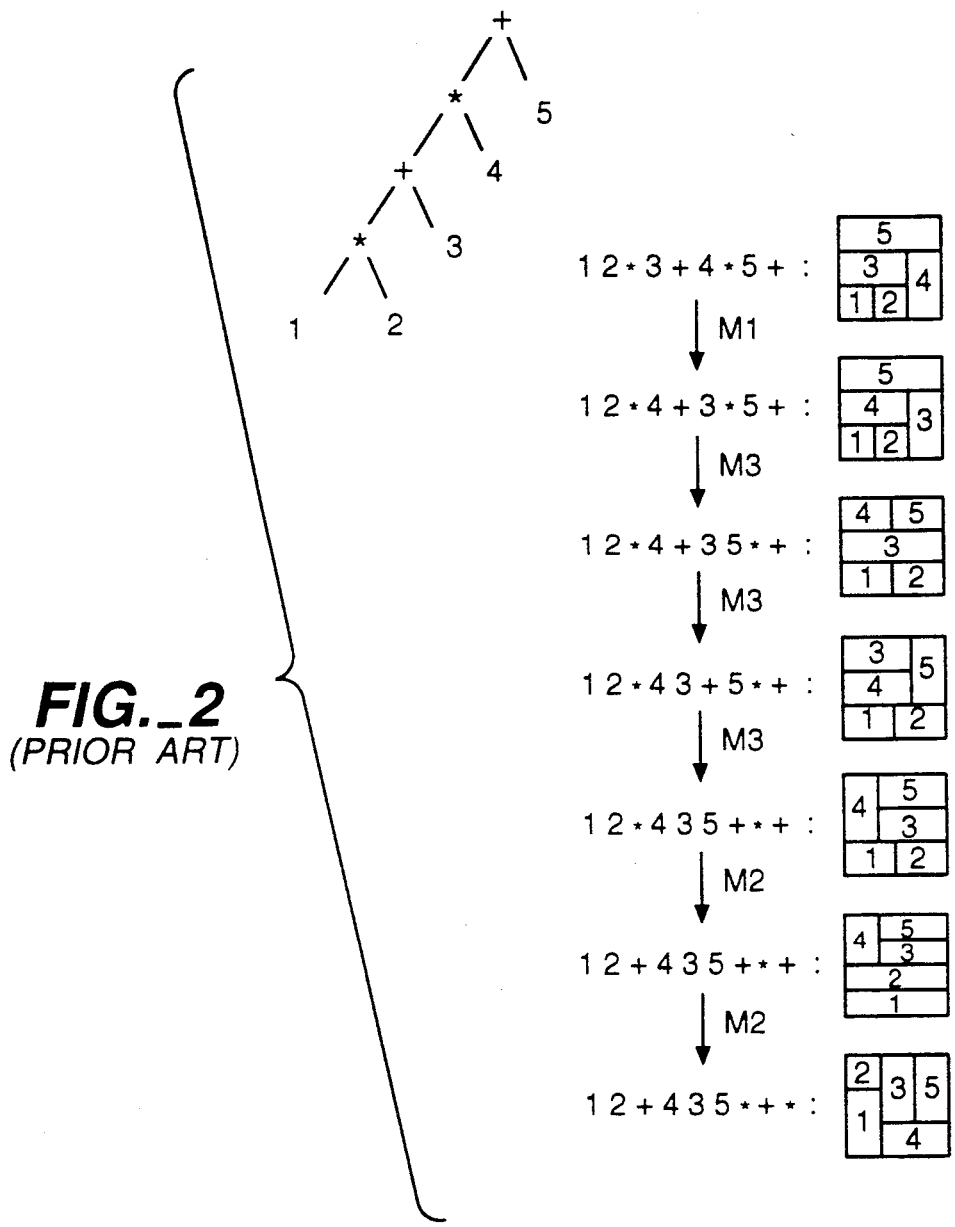
FIG._2
(PRIOR ART)

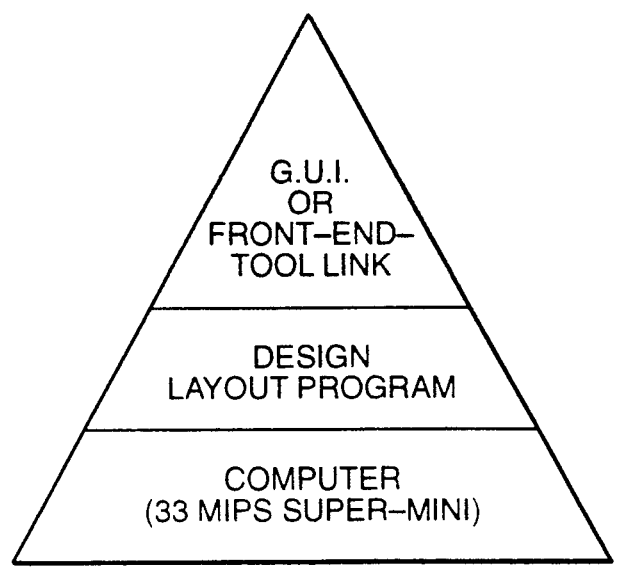
FIG._3
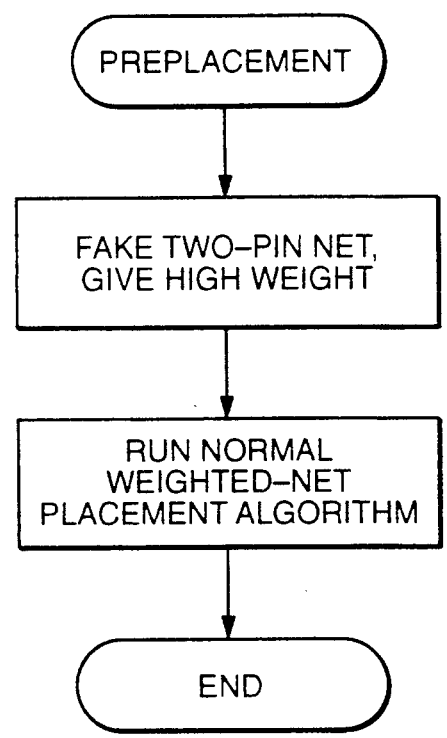
FIG._4

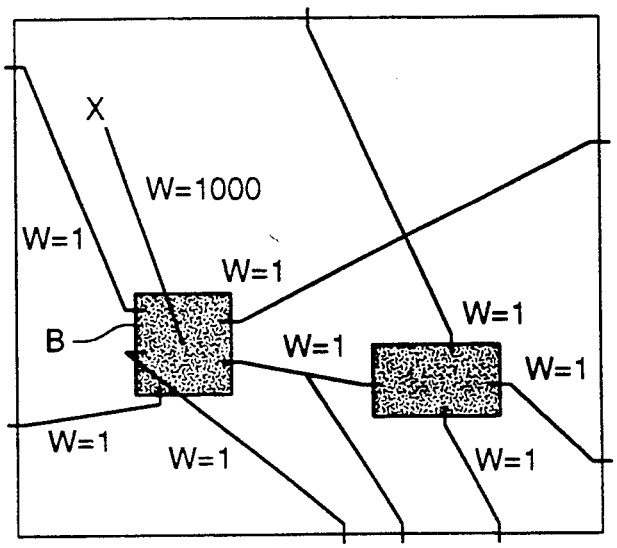
FIG._5
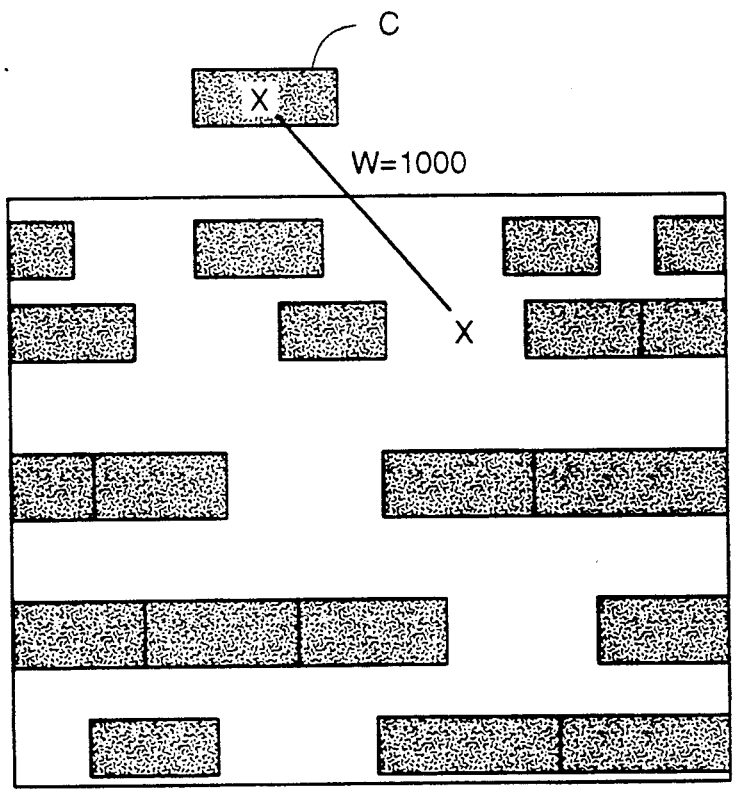
FIG._6

PREPLACEMENT METHOD FOR WEIGHTED NET PLACEMENT INTEGRATED CIRCUIT DESIGN LAYOUT TOOLS

BACKGROUND OF THE INVENTION

1. Field of the Invention

The present invention relates to computer-aided design of integrated circuits wherein circuit entities, or "cells", are placed on an integrated circuit layout and interconnected using computer design layout tools. In particular, the invention relates to "weighted-net" placement methods in which placement is influenced by weights assigned to interconnections between cells.

2. State of the Art

Design layout of integrated circuits has quickly progressed from a uniquely human endeavor to one that is human-directed but, to a large extent, machineimplemented. Design houses rely heavily on design layout tools to produce accurate, efficient designs in a small amount of time. Given a netlist description of an integrated circuit, the task of such tools is to place circuit modules on a layout of the integrated circuit and to route interconnections between the modules so as to achieve a compact layout without violating any design rules, which protect the functional integrity of the integrated circuit. Fully automatic layout systems for custom VLSI integrated circuits are presently available. Examples of such systems (followed in parenthesis by the university at which they were developed) are the PI system (Massachusetts Institute of Technology), the Magic system (University of California at Berkeley), the Phoenix system (Stanford) and the Timberwolf system (University of California at Berkeley). The PI system is named for the two principal parts of the layout problem, namely placement and interconnection (routing). The present invention is concerned only with placement and in particular preplacement, in which the placement of certain circuit entities is dictated or heavily influenced by some a priori information, possibly from the circuit designer.

The PI system is described in detail in Sherman, VLSI Placement and Routing: the PI Project (Springer-Verlag, 1989). Placement in the PI system uses a method known as "min-cut", a placement technique based on graph partitioning methods. Starting with a group of cells to be placed into a rectangular area, the area is divided into two equal areas either vertically or horizontally with the objective of dividing the cells into two approximately equal size groups such that the number of signals that cross the cutline between the two groups is minimized. This process is first applied to all the cells to be placed and is then successively repeated on each of the groups until each group contains less than the specified number of cells. Min-cut placement is illustrated in FIGS. 1A-1D. Modules are displayed as black rectangular regions. Whenever two or more modules overlap, however, regions with an even number of overlapping modules are displayed in white, and regions with an odd number of overlapping modules are displayed in black. In FIG. 1A, the first step of the min-cut process has partitioned the logic modules into two subsets and has sliced the logic box into two rectangles. The modules associated with each of the newly created rectangles are displayed at the origin of their associated rectangle. In FIG. 1B, the modules on the left side of the logic box have been partitioned into two subsets, and the associated rectangle has been sliced into two rectangles. In FIG. 1C, the modules on the right side of the logic box have been partitioned using a horizontal partition. At the conclusion of one version of the min-cut process, each module is associated with a unique leaf rectangle in the recursive slicing as shown in FIG. 1D.

Another placement method based on recursive slicing uses a slicing tree representation of module placement. A "slicing structure" is a rectangle dissection that can be obtained by recursively cutting rectangles into smaller rectangles. A "slicing tree" is a top down description of a slicing structure. It specifies how a given rectangle is cut into smaller rectangles by horizontal and vertical cutting lines. Referring to FIG. 2, each module is labelled with an integer number, or operand, and the operators + and * represent horizontal and vertical cuts, respectively. Each slicing structure may be represented by either a slicing tree or a corresponding "normalized Polish expression" of specified form. In FIG. 2, both the slicing tree and its corresponding normalized Polish expression appear next to the top-most slicing structure. Only the normalized Polish expression appears next to the remaining slicing structures.

In practice, the modules are initially assumed to be placed all horizontally next to one another, usually far from the optimal solution. By manipulating the corresponding normalized Polish expression, random moves are tried as shown in FIG. 2. Two adjacent operators may be swapped (move M1), an operand chain may be complemented (move M2), or an operand and an operator that are adjacent to one another may be swapped. For placement of general cells, which may have different sizes and shapes (as opposed to standard cells which have substantially uniform heights and are placed in rows), slicing tree placement is probably preferrable to min-cut placement.

In the Timberwolf system, placement is based on a method known as simulated annealing, a general-purpose optimization technique inspired by the physical annealing process. Starting with some arbitrary initial placement, a new placement is randomly generated by a perturbation to the current placement. If the new placement is better than the old placement as determined in accordance with a predefined cost function, then the new placement is accepted and replaces the old placement. If the new placement is inferior, the new placement may still be accepted depending on the "temperature" of the system. The temperature of the system is initially set to some large value and is progressively reduced in accordance with a "cooling schedule". If a large number of placements are generated at each temperature and the temperature is very slowly reduced, then simulated annealing may be expected to produce solutions with near-optimal values of the cost function.

Often during the design process, the circuit designer may wish to dictate or at least heavily influence the placement of a particular cell or module. Simulated annealing is very amenable to preplacement. In essence, the designer may simply specify that the cell occupy the desired position in the initial placement and not allow the cell to be moved during the simulated annealing process. Preplacement is also easily accommodated using a quadratic placement method. In general, placement methods that first do relative placement in space and then perform unoverlap and packing to obtain the final position of the cells can incorporate preplacement in the method by simply fixing the preplaced cells in space. Such placement algorithms, however, consume a large amount of computer time.

Min-cut and other similar placement methods are much faster than the foregoing class of algorithms. Preplacement however, is difficult. In general, cell placement algorithms involving iterative operations on a slice tree built from the cells make preplacement difficult. Preplacement using such algorithms has typically been attempted by, at each level of the iterative placement process, dictating with respect to a particular module a partial placement solution that is consistent with its ultimate desired placement. Such a method is inelegant and tedious.

What is needed, then, is a preplacement method that may be incorporated into design tools that find preplacement difficult.

SUMMARY OF THE INVENTION

The present invention, generally speaking, provides a preplacement method for use in a computer-assisted integrated design layout process in which circuit entities are placed by a computer program on a layout of an integrated circuit stored in computer memory. The circuit to be laid out is represented in computer memory as circuit entities interconnected between pins on the circuit entities. A set of pins to be interconnected forms a net and is assigned a weight. The inventive method allows a user to cause the computer program to place a circuit entity at a different location on the integrated circuit layout than it would be otherwise. A faked two pin net is defined, one pin being located within the circuit entity and another pin being located in a region of the integrated circuit in which the circuit entity is to be placed. A high weight is then assigned to the faked two pin net that is much greater than weights assigned to other nets in the integrated circuit layout. The computer program then places the circuit entity in the region of the other pin in accordance with the high weight assigned to the fake net.

BRIEF DESCRIPTION OF THE DRAWINGS

FIGS. 1A–1D are floor plans of an integrated circuit illustrating a min-cut placement process;

FIG. 2 is a diagram illustrating a slice tree placement process;

FIG. 3 is a diagram representing an environment of the inventive method;

FIG. 4 is a simplified flowchart of the preplacement method;

FIG. 5 is a diagram illustrating block preplacement by the preplacement method;

FIG. 6 is a diagram illustrating cell preplacement by the preplacement method.

DETAILED DESCRIPTION OF THE PREFERRED EMBODIMENTS

The present invention may be practiced in conjunction with any weightednet placement algorithm. For purposes of illustration, however, an exemplary environment in which the invention may be practiced is represented in FIG. 3. A computer platform (for example a 33 MIPS super-mini computer) is used to run a design layout program of the general type previously described. The layout program uses a weighted-net placement algorithm. Interaction between a user and the design layout program is achieved through a graphical user interface or a front-end-tool link.

The present method provides for preplacement of cells in a general cell placement algorithm. Cell preplacement is important to allow the user to preplace certain cells to meet specific design requirements including chip timing, noise immunity, power distribution, etc. The present method is believed to be the most desirable for small numbers of preplaced cells, because it offers preplacement without compromising a placement algorithm's normal cost function, which remains unchanged.

The method involves the use of imaginary pins and net weighting. Most general cell placement algorithms use the following as a cost function:

$$Cost = A + b * NetLengthCost$$

where
A is the total area,
NetLengthCost is the cost of net length, and
b is the weight to control the relative importance of area cost and net length cost.
NetLengthCost is computed as follows:

$$NetLengthCost = Sum\ over\ all\ nets\ [w(n) * L(n)]$$

where
L(n) is the length of net n,
w(n) is the weight for net n.

To preplace a cell, an imaginary pin is created at the preplaced location desired for the cell. Referring to FIG. 4, in a first step, the pin is connected to a faked two pin net, with the other pin being connected to the cell. The faked net is then given exceedingly high weight. A conventional weighted-net placement algorithm is then run (step two). During general cell placement, the cell will be moved to the desired location because of the high weight on the faked net.

A cell can be either hard or soft. Hard cells have fixed sizes. Soft cells have flexible aspect ratios which the algorithm can adjust to minimize the cost function.

Referring to FIG. 5, a block B is to be preplaced at location X. For this purpose, a fake two pin net is created with one of the pins located at X and the other of the pins located at the center of the block. The net is then given an exceedingly high weight relative to other nets in the circuit. In the example of FIG. 5, the faked net is given a weight of 1000 compared to weights of 1 on the other nets in the circuit. As a result, the block will be moved to the desired location. The faked two-pin net may be defined and given high weight by a user through a user interface of the design layout program. Alternatively, the two-pin net may be defined and given high weight according to defined criteria through a front-end-tool link.

Referring to FIG. 6, a cell C is to be preplaced at location X. Again, a fake two-pin net is created with one of the pins located at X and the other of the pins located at the center of the cell. As before, the faked net is given an exceedingly high weight (1000). During general cell placement, the cell will be moved to the desired location because of the high weight on the faked net.

This method can be applied to any placement algorithm involving the use of net weight. However, it is most useful for general cell placement algorithms that find cell preplacement difficult. Some difficult-to-preplace cell algorithms are those involving iterative operations on a slice tree built from the cells and the mincut algorithm. Other placement methods such as quadratic and simulated annealing with unconstrained operators, which first do relative placement in space and then perform unoverlap and packing to obtain the final positions of the cells, can incorporate preplacement in the algorithms by simply fixing the preplaced cells in space. Even though other methods of preplacement are possible, the method presented here is believed to be the most desirable because it offers preplacement without compromising a placement algorithm's normal cost function.

The foregoing has described the principles, preferred embodiments and modes of operation of the present invention. However, the invention should not be construed as limited to the particular embodiments discussed. The above-described embodiments should therefore be regarded as illustrative rather than restrictive. Variations may be made in those embodiments without departing from the scope of the present invention as defined by the following claims.

What is claimed is:

1. In a computer-assisted integrated circuit design layout process in which circuit entities are placed by a computer program on a layout of an integrated circuit stored in computer memory, a circuit to be laid out being represented in computer memory as circuit entities interconnected between pins on the circuit entities, a set of pins to be interconnected forming a net having a weight assigned thereto, a method of preplacing circuit entities whereby the computer program is caused to place a circuit entity at a different location on the integrated circuit layout than the computer program would otherwise place the circuit entity at, comprising the steps of:

defining a faked two-pin net, one pin being located within said circuit entity and another pin being located in a region of the integrated circuit, approximately the size of said circuit entry, in which the circuit is to be placed;

assigning a weight $W_F$ to said faked two-pin net that is greater than weights assigned to other nets in the integrated circuit layout;

the computer program then placing said circuit entity at least partially within said region of said another pin in accordance with said weight $W_F$ and said weights assigned other nets in the integrated circuit layout; and building the integrated circuit.

* * * * *